United States Patent
Kwon et al.

(10) Patent No.: US 7,061,565 B2
(45) Date of Patent: Jun. 13, 2006

(54) ARRAY SUBSTRATE HAVING DOUBLE-LAYERED METAL PATTERNS AND METHOD OF FABRICATING THE SAME

(75) Inventors: Oh-Nam Kwon, Cheonan-si (KR); Kyoung-Mook Lee, Seoul (KR); Nack-Bong Choi, Suwon-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 137 days.

(21) Appl. No.: 10/685,419

(22) Filed: Oct. 16, 2003

(65) Prior Publication Data
US 2005/0018097 A1  Jan. 27, 2005

(30) Foreign Application Priority Data
Nov. 8, 2002  (KR) .................. 10-2002-0069285

(51) Int. Cl.
*G02F 1/1343* (2006.01)
*G02F 1/136* (2006.01)
*H01L 31/20* (2006.01)
*H01L 29/04* (2006.01)
*H01L 21/20* (2006.01)

(52) U.S. Cl. .................. 349/139; 349/43; 349/147; 349/148; 257/59; 257/72; 438/584

(58) Field of Classification Search ............... 349/139, 349/43; 257/57, 59, 66, 72, 770, 763, 762; 348/158, 584, 597, 648, 642, 683, 687, 685
See application file for complete search history.

(56) References Cited
U.S. PATENT DOCUMENTS

| | | | |
|---|---|---|---|
| 6,307,602 B1 * | 10/2001 | Song .................. | 349/38 |
| 6,323,490 B1 * | 11/2001 | Ikeda et al. ............ | 250/370.09 |
| 6,393,042 B1 * | 5/2002 | Tanaka .................. | 372/101 |
| 6,404,465 B1 * | 6/2002 | Nakayama et al. ......... | 349/39 |
| 6,468,822 B1 * | 10/2002 | Maeda et al. .............. | 438/30 |
| 6,686,661 B1 * | 2/2004 | Lee et al. .................. | 257/741 |
| 6,861,368 B1 * | 3/2005 | Chae ...................... | 438/738 |
| 2001/0019375 A1 * | 9/2001 | Kwon et al. ................ | 349/43 |
| 2004/0041958 A1 * | 3/2004 | Hwang et al. ............... | 349/43 |

* cited by examiner

*Primary Examiner*—Andrew Schechter
*Assistant Examiner*—Hoan C. Nguyen
(74) *Attorney, Agent, or Firm*—McKenna Long & Aldridge LLP

(57) ABSTRACT

An array substrate having double-layered metal patterns for use in a liquid crystal display device and a manufacturing method thereof are disclosed in the present invention. The array substrate includes a gate electrode and a gate line each having a molybdenum alloy (Mo-alloy) layer and a copper (Cu) layer configured sequentially on a substrate; a gate insulation layer on the substrate to cover the gate electrode and the gate line; an active layer arranged on the gate insulation layer in a portion over the gate electrode; an ohmic contact layer on the active layer; a data line on the gate insulation layer, the data line crossing the gate line and defining a pixel region; source and drain electrodes on the ohmic contact layer, the source electrode extending from the data line, and the drain electrode spaced apart from the source electrode; a passivation layer on the gate insulation layer covering the data line and the source and drain electrode, the passivation layer having a drain contact hole exposing a portion of the drain electrode; and a pixel electrode configured on the passivation layer in the pixel region, the pixel electrode electrically contacting the drain electrode through the drain contact hole.

9 Claims, 9 Drawing Sheets

ARRAY SUBSTRATE HAVING DOUBLE-LAYERED METAL PATTERNS AND METHOD OF FABRICATING THE SAME

This application claims the benefit of the Korean Application No. P2002-0069285 filed on Nov. 8, 2002, which is hereby incorporated by reference for all purposes as if fully set forth herein.

BACKGROUND OF THE INVENTION

1. Field of the Invention

The present invention relates to a liquid crystal display device, and more particularly, to an array substrate having double-layered metal patterns and a manufacturing method thereof. Although the present invention is suitable for a wide scope of applications, it is particularly suitable for increasing a picture quality in the liquid crystal display device and a process stability during the fabrication process.

2. Discussion of the Related Art

In general, since flat panel display devices are thin, light weight, and have low power consumption, they have been used for displays of portable devices. Among the various types of flat panel display devices, liquid crystal display (LCD) devices are widely used for laptop computers and desktop computer monitors because of their superiority in resolution, color image display, and display quality.

Optical anisotropy and polarization properties of liquid crystal molecules are utilized to generate a desired image. Liquid crystal molecules have a specific alignment that results from their own peculiar characteristics. The specific alignment can be modified by electric fields that are applied upon the liquid crystal molecules. In other words, the electric fields applied upon the liquid crystal molecules can change the alignment of the liquid crystal molecules. Due to optical anisotropy, incident light is refracted according to the alignment of the liquid crystal molecules.

Specifically, the LCD devices include upper and lower substrates having electrodes that are spaced apart and face each other, and a liquid crystal material is interposed therebetween. Accordingly, when a voltage is applied to the liquid crystal material through the electrodes of each substrate, an alignment direction of the liquid crystal molecules is changed in accordance with the applied voltage in order to display images. By controlling the applied voltage, the LCD device provides various transmittances for rays of light to display image data.

The liquid crystal display (LCD) devices are widely applied in office automation (OA) and video equipment due to their characteristics of light weight, thin design, and low power consumption. Among different types of LCD devices, active matrix LCDs (AM-LCDs) having thin film transistors and pixel electrodes arranged in a matrix form offer high resolution and superiority in displaying moving images. A typical LCD panel has an upper substrate, a lower substrate, and a liquid crystal material layer interposed therebetween. The upper substrate, referred to as a color filter substrate, includes a common electrode and color filters. The lower substrate, referred to as an array substrate, includes switching elements such as thin film transistors (TFT's) and pixel electrodes.

As previously described, the operation of an LCD device is based on the principle that the alignment direction of the liquid crystal molecules depends upon applied electric fields between the common electrode and the pixel electrode. Accordingly, the liquid crystal molecules function as an optical modulation element having variable optical characteristics that depend upon the polarity of the applied voltage.

FIG. 1 is an expanded perspective view illustrating a related art active matrix LCD device. As shown in FIG. 1, the LCD device 11 includes an upper substrate 5, referred to as a color filter substrate, and a lower substrate 10, referred to as an array substrate, having a liquid crystal layer 9 interposed therebetween. On the upper substrate 5, a black matrix 6, and a color filter layer 7 are formed in a shape of an array matrix including a plurality of red (R), green (G), and blue (B) color filters surrounded by the black matrix 6. Additionally, a common electrode 18 is formed on the upper substrate 5 to cover the color filter layer 7 and the black matrix 6.

On the lower substrate 10, a plurality of thin film transistors T are formed in a shape of an array matrix corresponding to the color filter layer 7. A plurality of crossing gate lines 14 and data lines 22 are perpendicularly positioned such that each thin film transistor T is located adjacent to each intersection of the gate lines 14 and the data lines 22. Furthermore, a plurality of pixel electrodes 17 are formed on a pixel region P defined by the gate lines 14 and the data lines 22 of the lower substrate 10. The pixel electrode 17 includes a transparent conductive material having high transmissivity, such as indium-tin-oxide (ITO) or indium-zinc-oxide (IZO). Although not shown in FIG. 1, the LCD device 11 includes a backlight under the lower substrate 10. The backlight (not shown) irradiates light towards the lower and upper substrates 10 and 5.

In the related art LCD device shown in FIG. 1, a scanning signal is applied to a gate electrode of the thin film transistor T through the gate line 14, and a data signal is applied to a source electrode of the thin film transistor T through the data line 22. As a result, the liquid crystal molecules of the liquid crystal layer 9 are re-aligned and re-arranged by operation of the thin film transistor T, and incident light from the backlight (not shown) passing through the liquid crystal layer 9 is controlled to display an image. Namely, the electric fields induced between the pixel and common electrodes 17 and 18 re-arrange the liquid crystal molecules of the liquid crystal layer 9 so that the incident light can be converted into the desired images in accordance with the induced electric fields.

There are various factors that affect and define a picture quality of the LCD device 11. Among those various factors, electrical resistance of the gate and data lines 14 and 22 is an important requisition for achieving the improved picture quality in the LCD device 11. As the gate and data lines 14 and 22 have lower electrical resistance, the signal delay is reduced in those lines and thus the picture quality can become improved.

For the purpose of obtaining the reduced signal delay, copper (Cu) having relatively low electrical resistance is used for the gate and data lines 14 and 22. However, since copper (Cu) does not adhere well to the substrate, a buffer metal layer, for example, titanium (Ti) or molybdenum (Mo), may be used beneath the copper (Cu).

FIG. 2 is a cross-sectional view taken along line II–II' of FIG. 1, illustrating a pixel of a related art array substrate.

As shown in FIG. 2, the thin film transistor T is formed on an upper surface of the lower substrate 10. The thin film transistor T includes a gate electrode 30, an active layer 34, an ohmic contact layer 36, a source electrode 38, and a drain electrode 40. Between the gate electrode 30 and the active layer 34, a gate insulation layer 32 is interposed to protect the gate electrode 30 and the gate line 14. As shown in FIG. 2, the gate electrode 30 extends from the gate line 14 and the source electrode 38 extends from the data line 22. The gate line 14 and the gate electrode 30 are formed of the same material, and the data line 22 and the source and the drain electrodes 38 and 40 are formed of the same material. The active layer 34 and the ohmic contact layer 36 are formed of silicon, but the active layer 34 is intrinsic silicon and the ohmic contact layer 36 are n$^+$-doped silicon. A passivation layer 42 is formed on the thin film transistor T for protection. In the pixel region P defined by the pair of the gate and data lines 14 and 22, the pixel electrode 17 that is formed of a transparent conductive material is disposed on the passivation layer 42 while contacting the drain electrode 40 through a contact hole.

In the related art array substrate of FIG. 2, the gate line 14 and the gate electrode 30 have a double-layered structure having copper/titanium (Cu/Ti) double layers or copper/molybdenum (Cu/Mo) layers. Also the data line 22, the source electrode 38 and the drain electrode 40 have a double-layered structure having copper/titanium (Cu/Ti) double layers or copper/molybdenum (Cu/Mo) layers. For example, a lower part 14a of the gate line 14 is the titanium (Ti) or molybdenum (Mo) layer, and an upper part 14b of the gate line 14 is the copper (Cu) layer.

If the above-mentioned metal structures only have a single layer of copper (Cu), OXONE ($2KHSO_5 \cdot KHSO_4 \cdot K_2SO_4$) is generally used as an etchant to form the copper gate line and electrode. When forming the double-layered metal structure of copper/titanium (Cu/Ti), a mixed solution of OXONE, hydrogen fluoride (HF) and ammonium fluoride ($NH_4F$) is frequently used. However, when etching the copper/titanium (Cu/Ti) double layers using the mixed solution of OXONE, hydrogen fluoride (HF) and ammonium fluoride ($NH_4F$) to form the gate line and electrode, the mixture damages and unevenly etches the surface of the substrate due to that fact that F$^-$ ions are contained in the mixture solution. As a result, the damages and uneven etch of the substrate surface cause a decreased degree of image quality in the liquid crystal display device, such as generation of stained and spotted images.

Furthermore, when the copper/titanium (Cu/Ti) double layers are applied for the data line, the source electrode and the drain electrode, the underlying gate insulation layer is definitely etched and damaged by the etchant. Therefore, the damages and uneven etch of the gate insulation layer also cause the decreased degree of image quality in the liquid crystal display device.

FIG. 3 is a photograph of partially-etched copper/titanium (Cu/Ti) double layers taken by a SEM (Scanning Electron Microscope); and FIG. 4 is an enlarged view showing a portion of the etched copper/titanium (Cu/Ti) double layers of FIG. 3.

In FIGS. 3 and 4, a titanium (Ti) layer 52a is first formed on a substrate 50 and a copper (Cu) layer 52b is then formed on the titanium (Ti) layer. Then the copper/titanium (Cu/Ti) double layers 52 are wet-etched by the above-mentioned mixed solution. As indicated in FIG. 3, the substrate 50 has an irregularly etched and damaged surface 54.

In FIG. 4, it is much more noticeable that the surface of substrate 50 is severely corroded, although the Ti layer 52a and the Cu layer 52b are normally etched. Particularly, since the substrate 50 is glass, it is etched as much as about 400 angstroms (Å) from its primary surface, as indicated in FIG. 4.

When using the copper/molybdenum (Cu/Mo) layers for the double-layered metal patterns, the underlying molybdenum (Mo) layer is damaged and the copper (Cu) layer is undercut by the damaged molybdenum (Mo) layer, although the glass substrate is not damaged. Namely, the etchant for the copper/molybdenum (Cu/Mo) layers does not affect the glass substrate, but it damages the Mo layer and makes the Cu layer come off the substrate.

FIG. 5 is a photograph of partially-etched copper/molybdenum (Cu/Mo) double layers taken by the SEM (Scanning Electron Microscope); and FIG. 6 is an enlarged view showing a portion of the etched copper/molybdenum (Cu/Mo) double layers of FIG. 5.

In FIGS. 5 and 6, a molybdenum (Mo) layer 60b is first formed on a substrate 50 and a copper (Cu) layer 60a is then formed on the molybdenum (Mo) layer. Then the copper/molybdenum (Cu/Mo) double layers 60 are wet-etched by an etching solution. As indicated in FIG. 5, the surface of the substrate 50 is not damaged and has a smooth surface.

However, as indicated in a portion A of FIG. 6, the Mo layer 60b under the Cu layer 60a is over-etched inward and damaged. Therefore, the Cu layer 60a is in a separated state from the substrate 50. These phenomena reduce the adhesion between the substrate and the copper/molybdenum (Cu/Mo) double-layered metal pattern and thus deteriorate stability of the liquid crystal display device.

SUMMARY OF THE INVENTION

Accordingly, the present invention is directed to an array substrate having double-layered metal patterns and a method of fabricating the same that substantially obviates one or more of the problems due to limitations and disadvantages of the related art.

An advantage of the present invention is to provide an array substrate for a liquid crystal display device, which provides a double-layered metal pattern in which molybdenum alloy (Mo-alloy) is contained.

Another advantage of the present invention is to provide a method of forming an array substrate for a liquid crystal display device, which increases manufacturing process stability and increases a manufacturing yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for use in a liquid crystal display device is disclosed. The array substrate includes a gate electrode and a gate line each having a molybdenum alloy (Mo-alloy) layer and a copper (Cu) layer configured sequentially on a substrate; a gate insulation layer on the substrate to cover the gate electrode and the gate line; an active layer arranged on the gate insulation layer over the gate electrode; an ohmic contact layer on the active layer; a data line on the gate insulation layer, the data line crossing the gate line and defining a pixel region; source and drain electrodes on the ohmic contact layer, the source electrode extending from the data line, and the drain electrode spaced apart from the source electrode; a passivation layer on the gate insulation layer covering the data line and the source and drain electrode, the passivation layer having a drain contact hole exposing a portion of the drain electrode; and a pixel electrode on the passivation layer in the pixel region, the pixel electrode contacting the drain electrode through the drain contact hole.

In another aspect of the present invention, a method of fabricating an array substrate for used in a liquid crystal display device includes: forming a molybdenum alloy (Mo-alloy) layer and a copper (Cu) layer sequentially on a substrate; patterning the molybdenum alloy (Mo-alloy) layer and the copper (Cu) layer to form a Cu/Mo-alloy double-layered gate line and a Cu/Mo-alloy double-layered gate electrode, said gate line being disposed in a transverse direction and said gate electrode extending from the gate line; forming a gate insulation layer on the substrate to cover said gate line and said gate electrode; forming an active layer and an ohmic contact layer sequentially on the gate insulation layer, over said gate electrode; forming a data line, a source electrode and a drain electrode, wherein the data line is disposed on the gate insulation layer and crosses the gate line to define a pixel region, the source electrode extends from the data line on the ohmic contact layer, and the drain electrode is spaced apart from the source electrode on the ohmic contact layer; forming a passivation layer on the gate insulation layer to cover the data line, the source electrode and the drain electrode, wherein the passivation layer has a drain contact hole that exposes a portion of the drain electrode; and forming a pixel electrode on the passivation layer having contact with the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
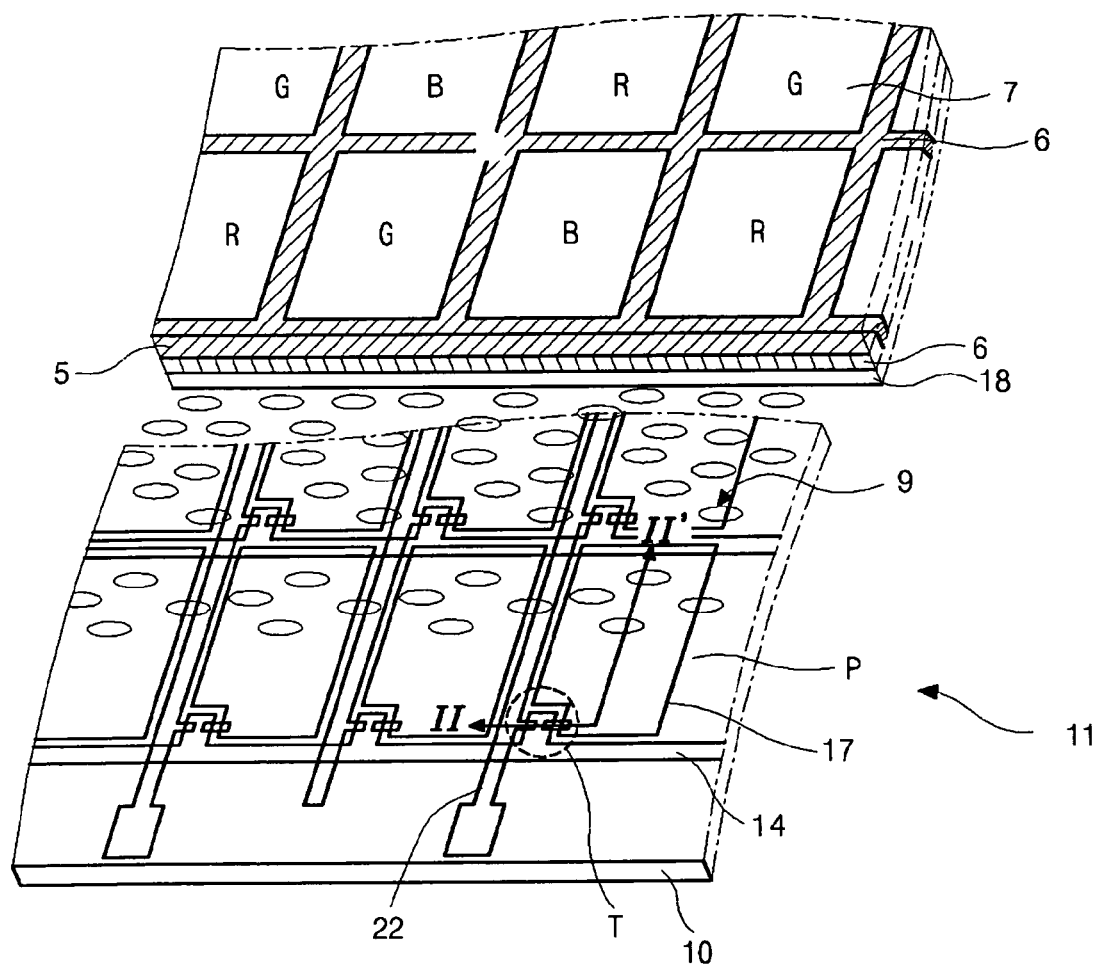
FIG. 1 is an expanded perspective view illustrating a related art liquid crystal display device.
Figure 2:
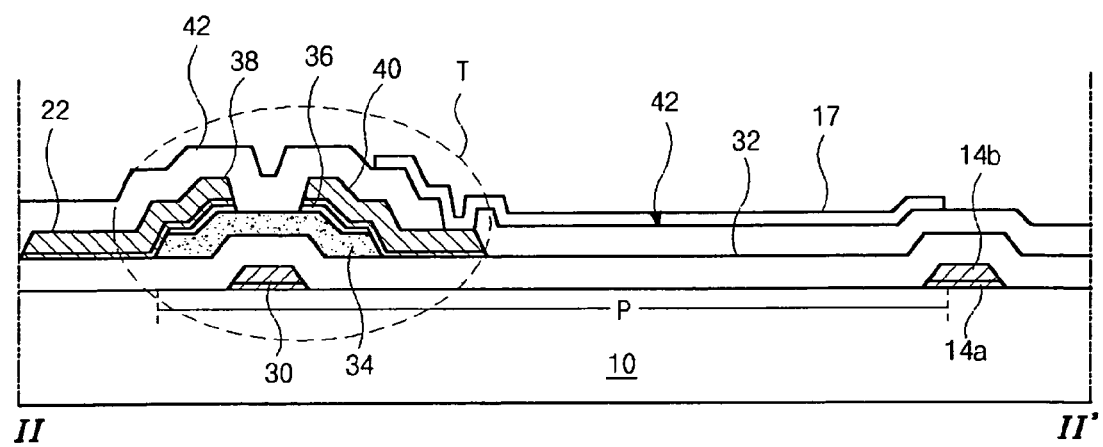
FIG. 2 is a schematic cross-sectional view taken along line II–II' of FIG. 1, illustrating a pixel of the related art array substrate.
Figure 3:
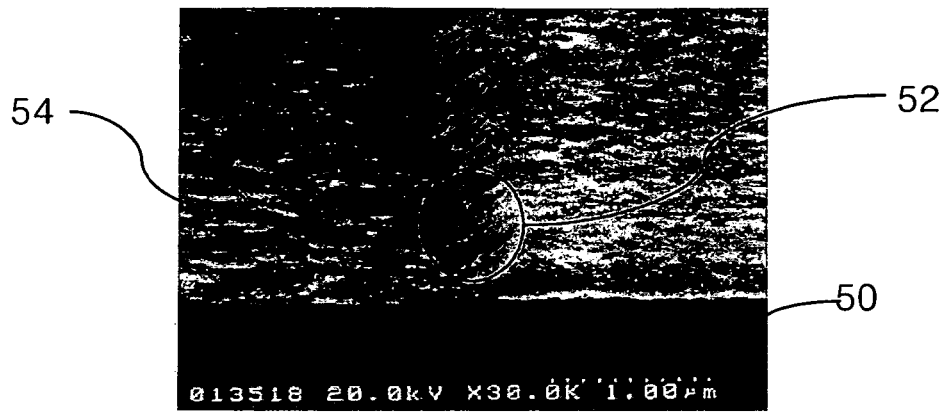
FIG. 3 is a photograph of partially-etched copper/titanium (Cu/Ti) double layers taken by a SEM (Scanning Electron Microscope)
Figure 4:
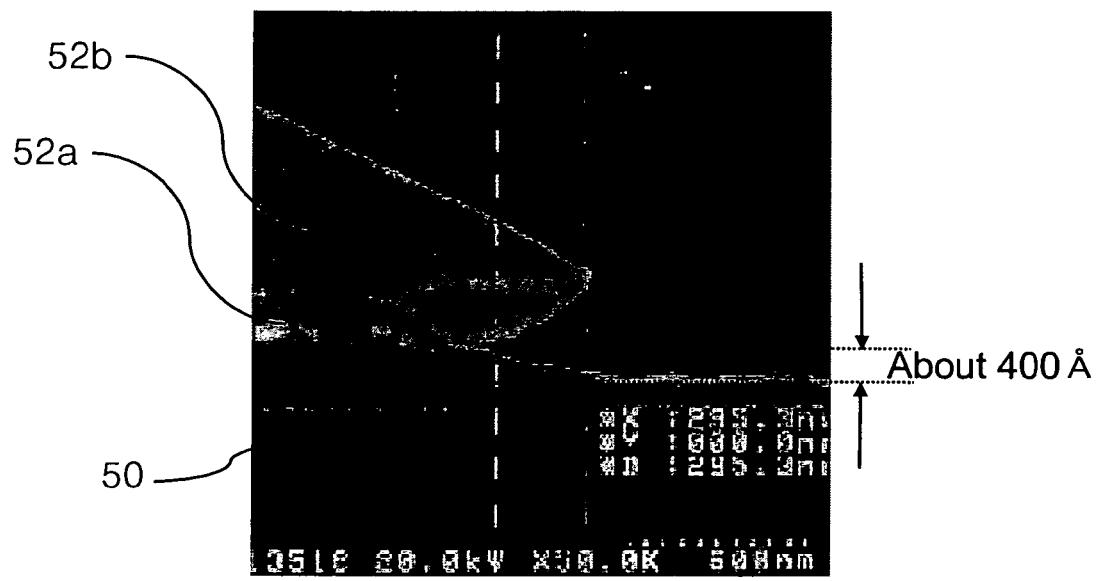
FIG. 4 is an enlarged view showing a portion of the etched copper/titanium (Cu/Ti) double layers of FIG. 3.
Figure 5:
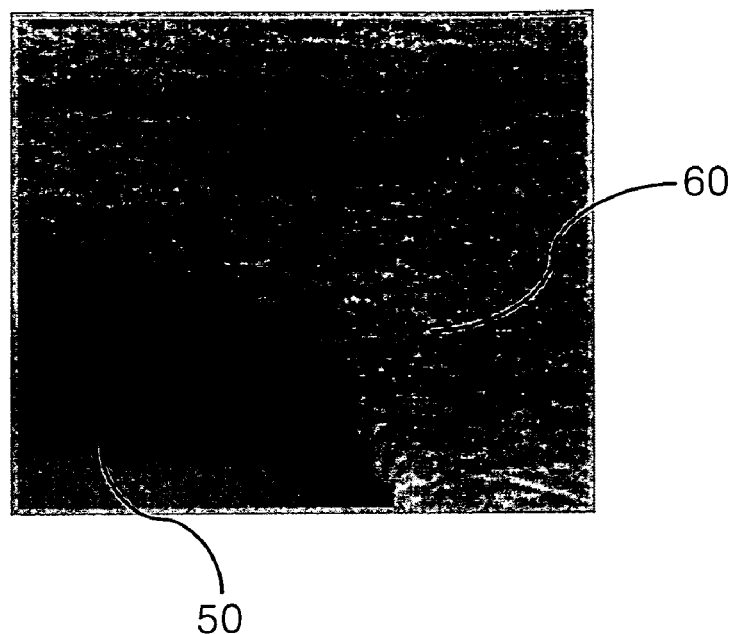
FIG. 5 is a photograph of partially-etched copper/molybdenum (Cu/Mo) double layers taken by a SEM (Scanning Electron Microscope)
Figure 6:
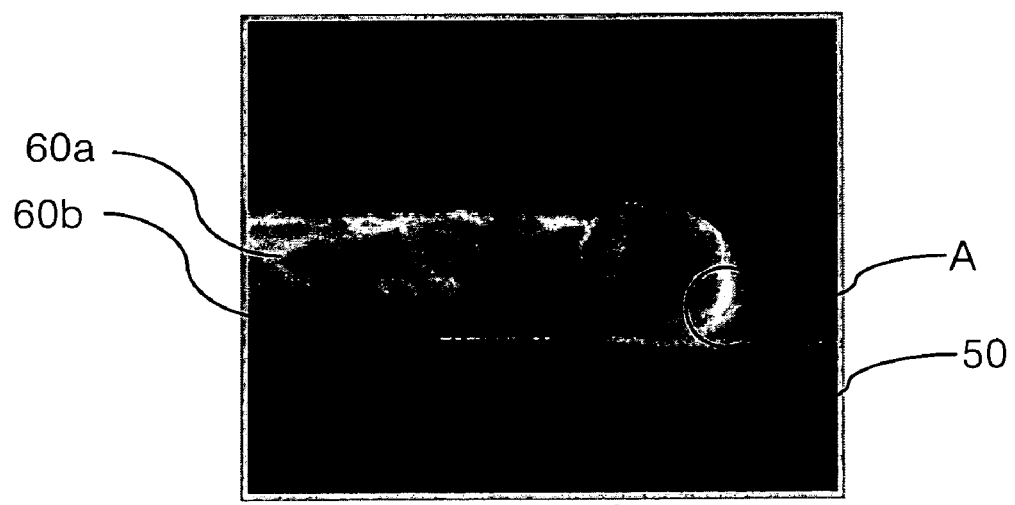
FIG. 6 is an enlarged view showing a portion of the etched copper/molybdenum (Cu/Mo) double layers of FIG. 5.
Figure 7:
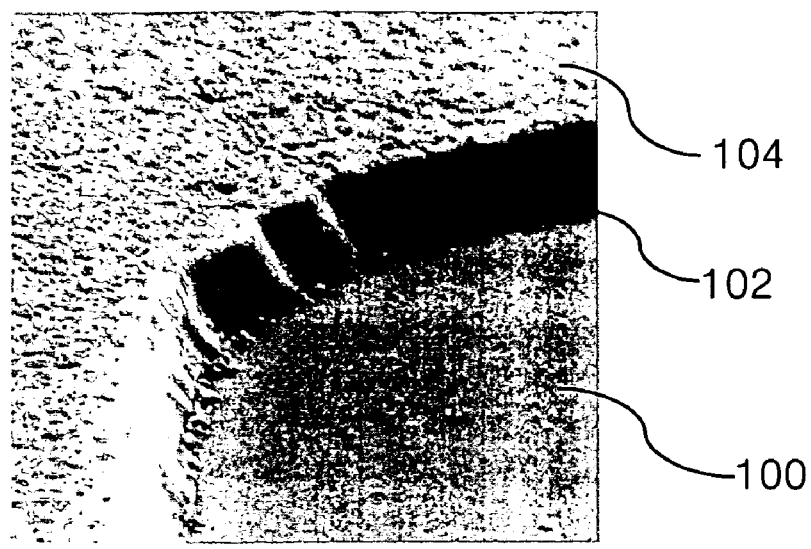
FIG. 7 is a photograph of partially-etched copper/molybdenum-alloy (Cu/Mo-alloy) double layers taken by a SEM (Scanning Electron Microscope)
Figure 8:
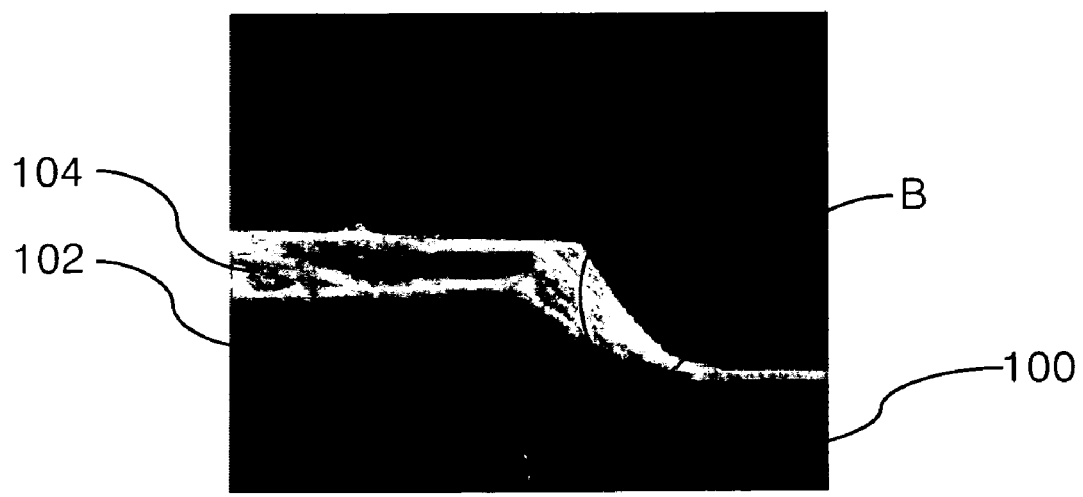
FIG. 8 is an enlarged view showing a portion of the etched copper/molybdenum-alloy (Cu/Mo-alloy) double layers of FIG. 7.

FIG. 7 is a photograph of partially-etched copper/molybdenum-alloy (Cu/Mo-alloy) double layers taken by a Scanning Electron Microscope (SEM). FIG. 8 is an enlarged view showing a portion of the etched copper/molybdenum-alloy (Cu/Mo-alloy) double layers of FIG. 7.

As shown in FIGS. 7 and 8, a molybdenum alloy (Mo-alloy) layer 102 is first formed on a substrate 100 and then a copper (Cu) layer 104 is sequentially formed on the molybdenum alloy (Mo-alloy) layer 102. Thereafter, the Mo-alloy layer 102 and the Cu layer 104 are patterned to form a Cu/Mo-alloy double-layered metal pattern. After patterning, a surface of the substrate 100 is smoothed, as indicated in FIG. 7. The Mo-alloy layer 102 is 10 to 500 angstroms (Å) in thickness, and the Cu layer 104 is 500 to 5000 angstroms (Å) in thickness.

In FIG. 8, the patterned Mo-alloy layer 102 is formed on the substrate 100 and then the patterned Cu layer 104 is formed on the Mo-alloy layer 102. Unlike the related art shown in FIGS. 3–6, the substrate 100 is not unevenly etched and damaged. Furthermore, the Mo-alloy layer 102 is not damaged and corroded under the Cu layer 104. Namely, the Mo-alloy layer 102 and the Cu layer 104 are properly etched to have a taper shape B, as shown in FIG. 8. Accordingly, it is clear that if the Mo-alloy layer is used as a buffer metal layer under the Cu layer, an etching solution for the Cu/Mo-alloy double layers does not hurt the substrate and the underlying Mo-alloy layer, thereby increasing the adhesion of the Cu layer to the substrate and improving the stability of the liquid crystal display device. In the present invention, the molybdenum alloy (Mo-alloy) includes tungsten (W), neodymium (Nd), niobium (Nb) or the combination thereof.

Figure 9:
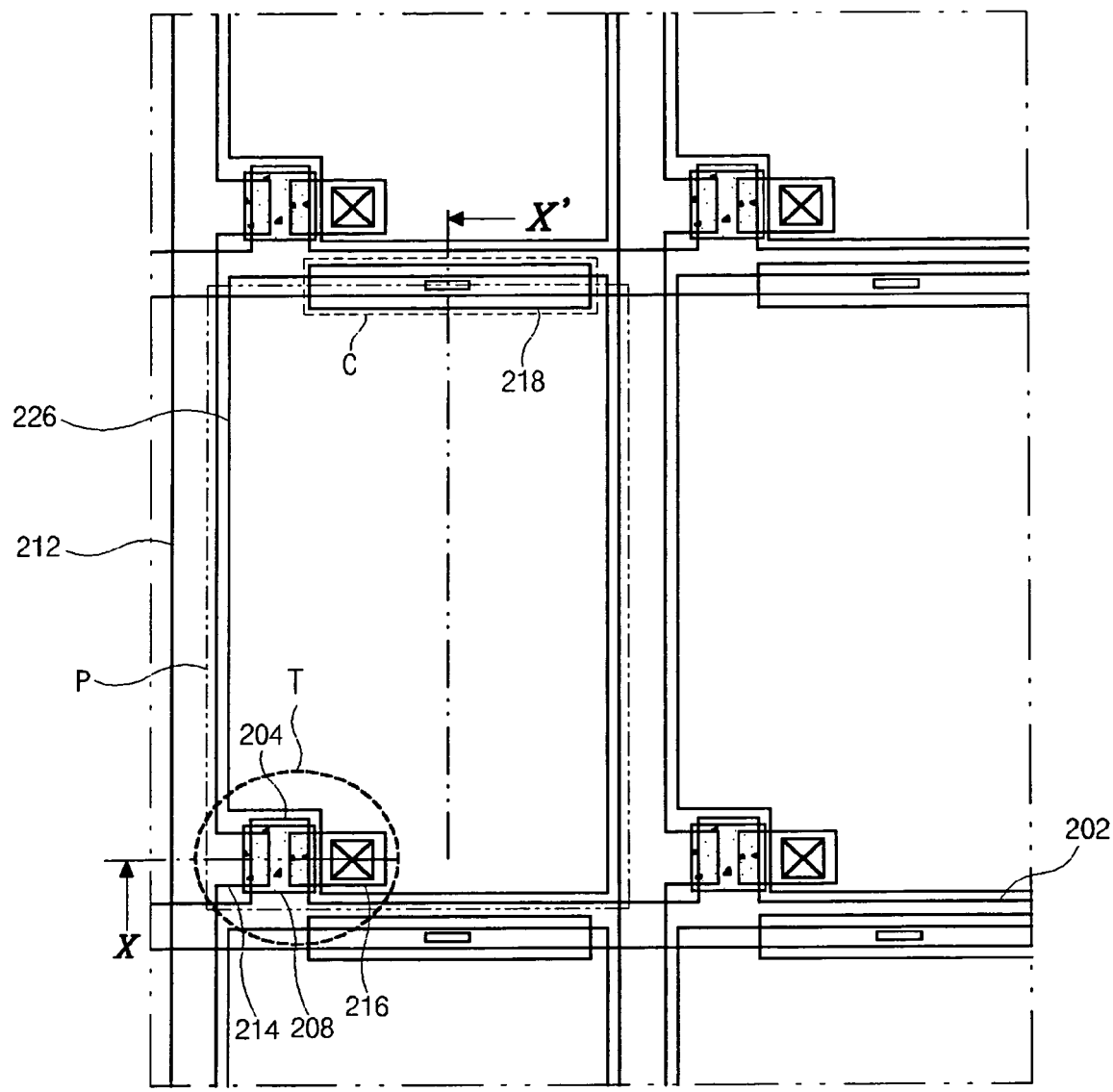
FIG. 9 is a partially enlarged plan view of an array substrate having copper/molybdenum-alloy (Cu/Mo-alloy) double-layered metal patterns according to the present invention.

FIG. 9 is a partially enlarged plan view of an array substrate having copper/molybdenum-alloy (Cu/Mo-alloy) double-layered metal patterns according to the present invention.

As shown in FIG. 9, an array substrate includes a plurality of gate lines 202 disposed in a transverse direction and a plurality of data lines 212 disposed in a longitudinal direction. The plurality of gate lines 202 and the plurality of data lines 212 cross one another defining a pixel region P. A thin film transistor T is formed at each crossing portion of the gate line 202 and the data line 212. The thin film transistor T includes a gate electrode 204, an active layer 208, a source electrode 214, and a drain electrode 216. In the pixel region P defined by a pair of gate and data lines 202 and 212, a pixel electrode 226 is located in contact with the drain electrode 216.

In the present embodiment, the gate lines 202 and the data lines 212 are formed of the above-mentioned Cu/Mo-alloy double layers. Furthermore, the gate electrode 204, the source electrode 214 and the drain electrode 216 are also formed of the Cu/Mo-alloy double layers. Alternatively, the data line 212, the source electrode 214 and the drain electrode 216 may be formed of a single layer of copper (Cu).

A storage capacitor C is located over the gate line 202, and includes a portion of the gate line 202 and a storage metal layer 218. Thus, the portion of the gate line 202 acts as a first electrode of the storage capacitor C, and the storage metal layer 218 acts as a second electrode of the storage capacitor C. The storage metal layer 218 may be formed with the data line 212 in the same process, and it can be Cu/Mo-alloy double layers or a Cu single layer. The pixel electrode 226 electrically contacts the storage metal layer 218, so that they are electrically connected to the storage capacitor C in parallel.

FIGS. 10A–10E are cross-sectional views taken along a line X–X' of FIG. 9 and illustrate fabrication process steps of forming an array substrate having copper/molybdenum-alloy (Cu/Mo-alloy) double-layered metal patterns according to the present invention.

Figure 10A:
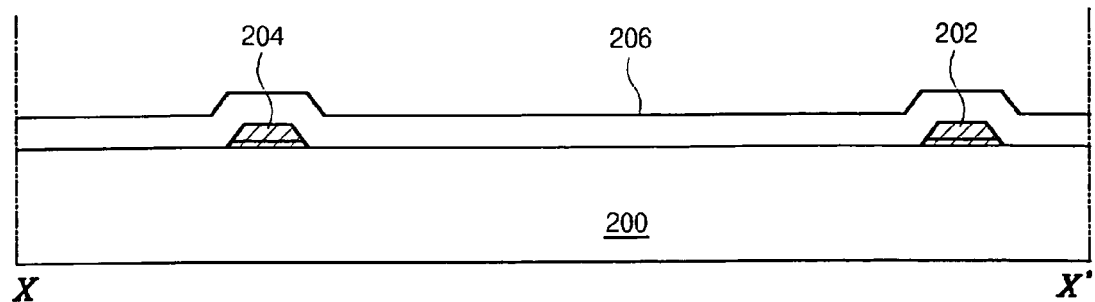
FIGS. 10A–10E are cross-sectional views taken along a line X–X' of FIG. 9 and illustrate fabrication process steps of forming an array substrate having copper/molybdenum-alloy (Cu/Mo-alloy) double-layered metal patterns according to the present invention.

In FIG. 10A, a first metal layer of molybdenum alloy (Mo-alloy) is deposited on a substrate 200, and then a second metal layer of copper (Cu) is formed on the first metal layer of Mo-alloy. Thereafter, the Cu/Mo-alloy double layers are simultaneously patterned to form a gate line 202 and a gate electrode 204 on the substrate 200. The first metal layer of molybdenum alloy (Mo-alloy) has a thickness ranging from about 10 to about 500 angstroms (Å), and the second metal layer of copper (Cu) has a thickness ranging from about 500 to about 5000 angstroms (Å). For example, the first metal layer of molybdenum alloy (Mo-alloy) may be about 100 angstroms (Å), and the second metal layer of copper (Cu) may be about 2000 angstroms (Å).

Thereafter, a gate insulation layer 206 (or a first insulating layer) is formed on the substrate 200 to cover the Cu/Mo-alloy double-layered gate line 202 and the Cu/Mo-alloy double-layered gate electrode 204. The gate insulation layer 206 is formed of an inorganic material, such as silicon nitride ($SiN_x$) and silicon oxide ($SiO_2$).

Figure 10B:
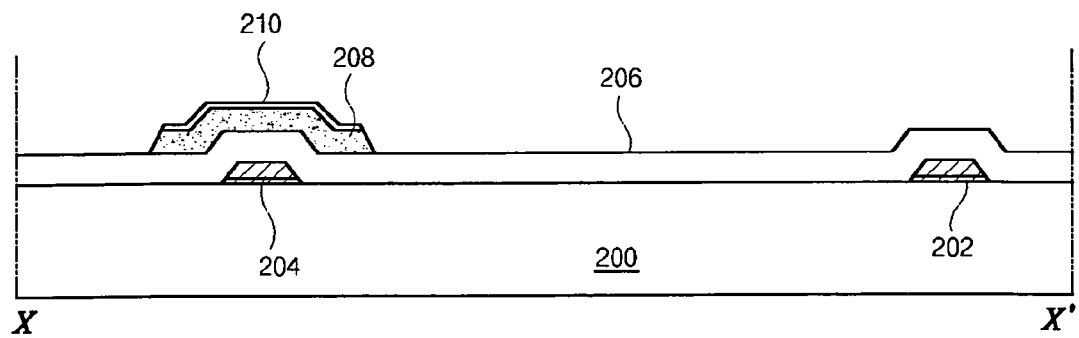

In FIG. 10B, an intrinsic amorphous silicon layer (a-Si:H) and then an $p^+$ or $n^+$-doped amorphous silicon layer ($n^+$a-Si:H) are sequentially deposited on the entire surface of the gate insulation layer 206 and simultaneously patterned to form both an active layer 208 and an ohmic contact layer 210 on the gate insulation layer 206, especially over the gate electrode 204. The ohmic contact layer 210 is then located on the active layer 208.

Figure 10C:
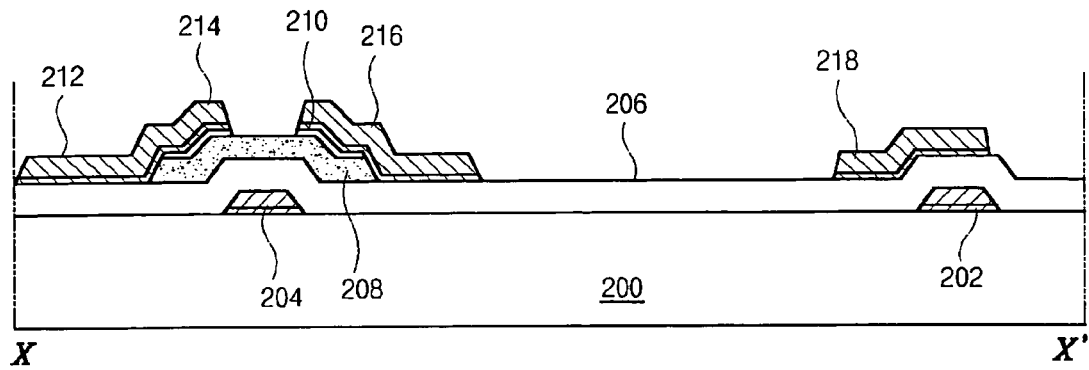

Next in FIG. 10C, after forming the active layer 208 and the ohmic contact layer 210, a third metal layer of molybdenum alloy (Mo-alloy) and a fourth metal layer of copper (Cu) are sequentially formed over the entire substrate to cover the active and ohmic contact layers 208 and 210. Thereafter, those metal layers are patterned to form a source electrode 214, a drain electrode 216, a data line 212, and a storage metal layer 218. As shown in FIG. 9, the data line 212 is substantially perpendicular to the gate line 202 and crosses the gate line 202 to define the pixel region. The source electrode 214 extends from the data line 212, and the drain electrode 216 is spaced apart from the source electrode 214 across the gate electrode 204. The storage metal layer 218 is disposed over the gate line 202. The Mo-alloy layers underlying the Cu layer have good contact characteristics with the silicon of the active and ohmic contact layers 208 and 210. Furthermore, the Mo-alloy layer prevents the silicon ions from diffusing into the copper layer.

Meanwhile, the data line 212, the source electrode 214, the drain electrode 216 and the storage metal layer 218 can be formed of a single layer of copper (Cu) instead of the Cu/Mo-alloy double layers. Furthermore, silver (Ag), silver alloy (Ag-alloy) and copper alloy (Cu-alloy) can be used for the above-mentioned double-layered metal patterns instead of copper (Cu).

Figure 10D:
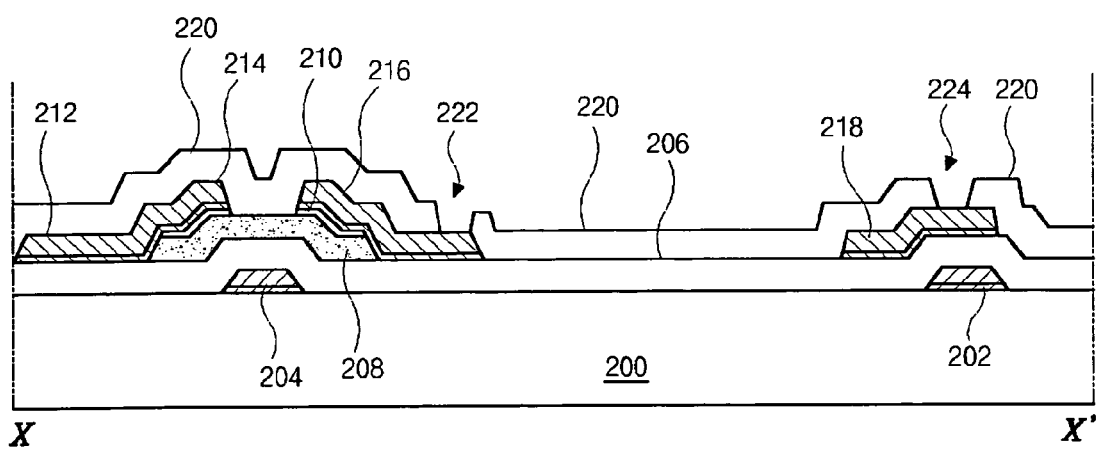

In FIG. 10D, a passivation layer (i.e., a second insulating layer) 220 is deposited over the entire surface of the substrate 200 to cover the patterned Cu/Mo-alloy double layers. The passivation layer 220 protects the data line 212, the source electrode 214, the drain electrode 216 and the storage metal layer 218. The passivation layer 220 may be formed of an inorganic material, such as silicon nitride ($SiN_x$) or silicon oxide ($SiO_2$), or an organic material, such as benzocyclobutene (BCB) or acrylic resin. Thereafter, the passivation layer 220 is patterned to form a drain contact hole 222 and a storage contact hole 224. The drain contact hole 222 exposes a portion of the drain electrode 216, and the storage contact hole 224 exposes a portion of the storage metal layer 218.

Figure 10E:
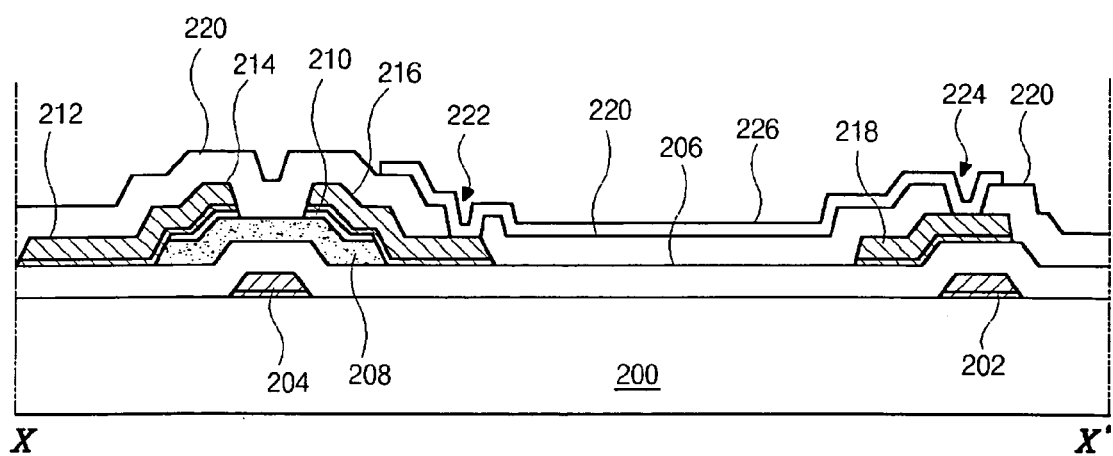

FIG. 10E illustrates a step of forming a pixel electrode on the passivation layer 220. A transparent conductive material, such as indium tin oxide (ITO) or indium zinc oxide (IZO), is deposited on the passivation layer 220 and then patterned to form a pixel electrode 226 in the pixel region. As illustrated in FIG. 10E, the pixel electrode 226 contacts both the drain electrode 216 through the drain contact hole 222 and the storage metal layer 218 through the storage contact hole 224. Therefore, the array substrate of the present invention is complete.

In the present invention, the Cu/Mo-alloy double layers form the gate line and the gate electrode, whereby the substrate does not have any surface damage. Moreover, the gate line and electrode have a stronger adhesion to the substrate. Additionally, the gate insulation layer is not damaged because the data line and the source and drain electrodes are formed of the Cu/Mo-alloy double layers. As a result, the present invention provides improved production yield. Since copper, having a low electrical resistance, is used for the gate and data lines, the liquid crystal display device has an improved picture quality.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An array substrate for use in a liquid crystal display device, comprising:
    a gate electrode and a gate line, each having a molybdenum alloy (Mo-alloy) layer including one of tungsten (W), neodymium (Nd), niobium (Nb) and the combination thereof and a copper (Cu) layer on a substrate, wherein the Mo-alloy layer is formed on the substrate and the Cu layer is formed on the Mo-alloy layer;
    a gate insulation layer on the substrate to cover the gate electrode and the gate line;
    an active layer arranged on the gate insulation layer in a portion over the gate electrode;
    an ohmic contact layer on the active layer;
    a data line on the gate insulation layer, the data line crossing the gate line and defining a pixel region;
    source and drain electrodes on the ohmic contact layer, the source electrode extending from the data line, and the drain electrode spaced apart from the source electrode;
    a passivation layer on the gate insulation layer covering the data line and the source and drain electrodes, the passivation layer having a drain contact hole exposing a portion of the drain electrode; and a pixel electrode configured on the passivation layer in the pixel region, the pixel electrode electrically contacting the drain electrode through the drain contact hole.

2. The substrate according to claim 1, further comprising a storage metal layer configured over a portion of the gate line.

3. The substrate according to claim 2, wherein the storage metal layer is formed with the data line on the gate insulation layer.

4. The substrate according to claim 2, wherein the pixel electrode electrically contacts the storage metal layer via a storage contact hole.

5. The substrate according to claim 2, wherein the data line, the source electrode, the drain electrode and the storage metal layer are all formed of a double-layered metal pattern consisting of a lower part of molybdenum alloy (Mo-alloy) and an upper part of copper (Cu).

6. The substrate according to claim 5, wherein the molybdenum alloy (Mo-alloy) includes one of tungsten (W), neodymium (Nd), niobium (Nb) and the combination thereof.

7. The substrate according to claim 2, wherein the data line, the source electrode, the drain electrode and the storage metal layer are all formed of a single layer of copper (Cu).

8. The substrate according to claim 1, wherein the molybdenum alloy layer of the gate electrode and gate line has a thickness in a range from about 10 to about 500 angstroms.

9. The substrate according to claim 1, wherein the copper layer has a thickness in a range from about 500 to about 5000 angstroms.

* * * * *